United States Patent [19]

Suzuki

[11] Patent Number: 5,566,082

[45] Date of Patent: Oct. 15, 1996

[54] METHOD OF DETECTING A FAULT SECTION OF BUSBAR

[75] Inventor: Isamu Suzuki, Kawasaki, Japan

[73] Assignee: Fuji Electric Co., Ltd., Kawasaki, Japan

[21] Appl. No.: 161,513

[22] Filed: Dec. 6, 1993

[30] Foreign Application Priority Data

Dec. 4, 1992 [JP] Japan .................................. 4-325569
Apr. 27, 1993 [JP] Japan .................................. 5-099996

[51] Int. Cl.⁶ .................................................. G01R 31/08
[52] U.S. Cl. .......................... 364/492; 364/483; 324/522; 324/539; 324/543; 361/63; 361/87
[58] Field of Search .................................. 364/481, 483, 364/492; 324/512, 522, 539, 543, 537; 361/93

[56] References Cited

U.S. PATENT DOCUMENTS

| | | | |
|---|---|---|---|
| 3,771,049 | 11/1973 | Piccione | 340/664 |
| 4,096,539 | 6/1978 | Scaturro | 361/93 |
| 4,290,013 | 9/1981 | Thiel | 324/555 |
| 4,314,199 | 2/1982 | Yamaura et al. | 324/522 |
| 4,459,693 | 7/1984 | Prang et al. | 324/73.1 |
| 4,464,621 | 8/1984 | Prigent et al. | 324/522 |
| 4,514,845 | 4/1985 | Starr | 395/183.19 |
| 4,855,861 | 8/1989 | Bergman et al. | 364/483 |
| 5,043,655 | 8/1991 | Anholm, Jr. et al. | 364/481 |
| 5,125,738 | 6/1992 | Kawamura et al. | 356/44 |
| 5,138,257 | 8/1992 | Katsura | 324/537 |
| 5,138,265 | 8/1992 | Kawamura et al. | 324/535 |
| 5,250,894 | 10/1993 | Bridges et al. | 324/117 H |
| 5,399,974 | 3/1995 | Eriksson et al. | 324/522 |

*Primary Examiner*—James P. Trammell
*Assistant Examiner*—Kyle J. Choi
*Attorney, Agent, or Firm*—Kanesaka & Takeuchi

[57] ABSTRACT

The method is to detect a fault on a busbar and to specify the faulted point to a specific section of the busbar in order to provide a proper protection. If the fault has occurred, for instance, on a point P of a section between current transformer BCT- and a connecting point thereof to the busbar, or on a point Q of a busbar section between adjacent line outlets, the resulting fault current is expressed as a calculation sum of an output current of the current transformer BCT-. The foregoing current is zero in a normal condition, but in case of a fault, it reaches a definite value other than zero. Noticing this point, the fault current is computed for each section on the basis of the observable output current of the current transformer BCT-, and it is judged that if the foregoing current of a specific section exceeds a predetermined threshold, the fault has occurred on the above section.

12 Claims, 5 Drawing Sheets

METHOD OF DETECTING A FAULT SECTION OF BUSBAR

BACKGROUND OF THE INVENTION AND RELATED ART STATEMENT

The present invention relates to a busbar protection method, in particular, in order to protect a busbar of transmission and distribution system in electricity, it relates to a method of detecting a fault on the busbar and particularly specifying a specific fault section of the busbar.

Figure 2:
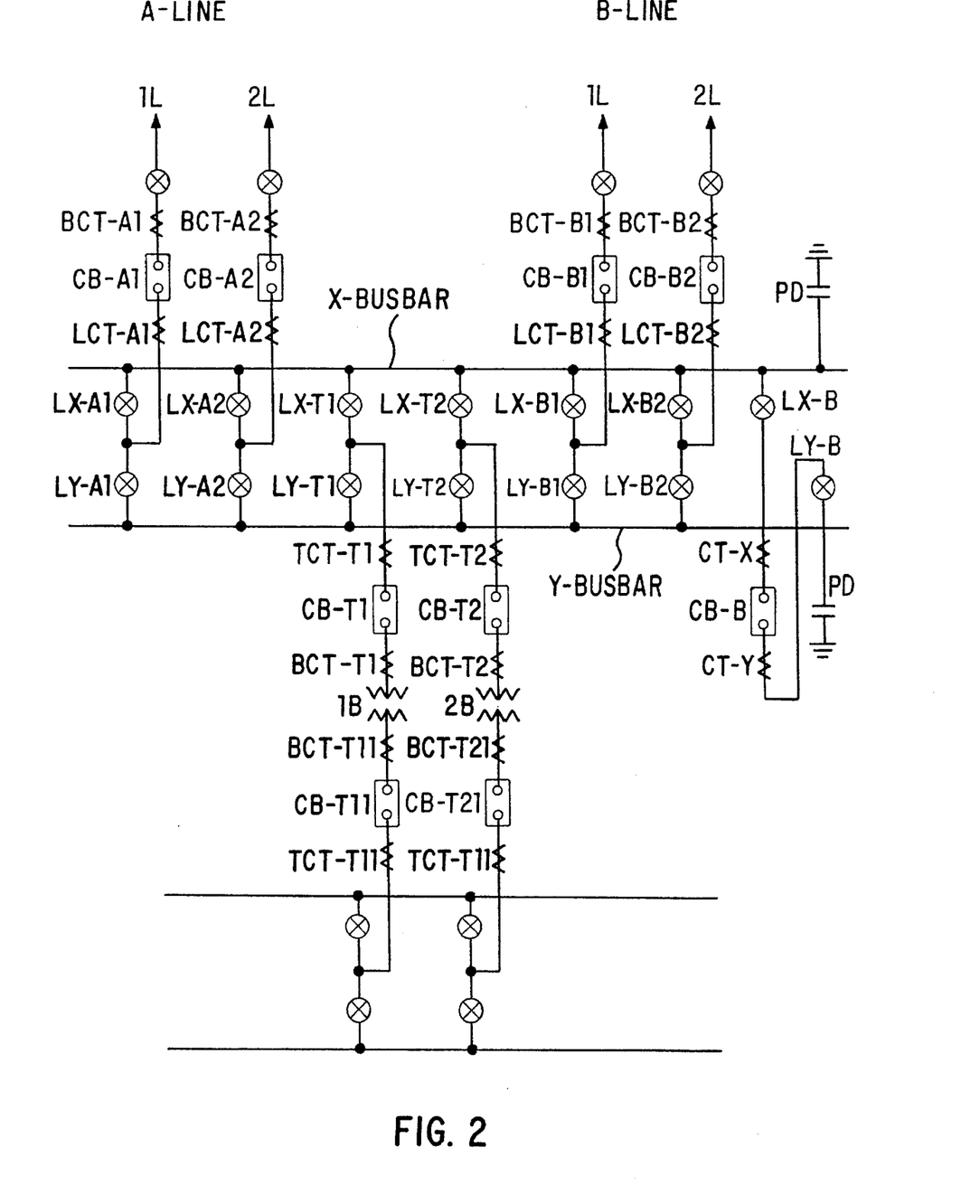
FIG. 2 is a single line diagram of a substation in general.

FIG. 2 shows a part of a single line diagram in a substation illustrating a high voltage busbar in detail. The detail structure of a low voltage busbar, which is connected to low voltage transformers 1B and 2B, is omitted in this figure.

There are two busbars X and Y, and interlink lines arranged to interlink both X- and Y-busbars to be selectably connected to either one of the busbars. The transformers 1B and 2B as well as the transmission lines A and B are connected to the foregoing interlink lines and further to the X- and Y- busbars via line switches LX- and LY-, which serve to selectively connect the foregoing transformers and transmission lines to either of the X- and Y-busbars. The line switches LX- and LY- are generally called disconnecting switches. In many cases, an apparatus not illustrated in the figure is also connected to the two or double busbars in the same way.

Reference alphabets in the figure are designated as CB for the circuit breaker, as BCT for the current transformer at a side away from the busbar, as LCT for the current transformer near the busbar, as TCT for the current transformer, as X for the X-busbar, and as Y for the Y-busbar. Reference alphabets with numeral following hyphen designate locations where the apparatus is installed. However, omission of the characters following hyphen, such as the above LX-, designates general expression not related to the location where the apparatus is installed.

The lines A-1L, A-2L, B-1L and B-2L as well as the transformers 1B and 2B are connected to the double busbars via the circuit breakers CB-. The current transformers are installed on both sides of the circuit breakers CB-. The current transformers LCT-connected to the busbar serve to protect the lines or the apparatus, such as transformers, and the current transformers BCT- connected to the line or the apparatuses serve to protect the busbar. The current transformers LCT- and BCT- may be collectively connected to the busbars, the lines or the apparatus, wherein the current transformers which are installed near the busbar are designated as LCT-, and those connected to the apparatuses are designated as BCT-. As shown in the figure, other interlink lines which interlink both of the busbars are circuit breakers CB-B, LX-B and LY-B as well as CT-X and CT-Y.

Lines, such as transmission lines, and apparatus, such as transformers, are connected in general to the double busbars so as to equalize load of both of the busbars as much as possible. If the line 1L is connected to the X-busbar, for instance as shown in the following FIG. 3, then the line 2L is connected to the Y-busbar. As results, the current flowing through the circuit breaker CB-B which interlinks between the busbars is nearly zero.

There has been known a protection method of the two or double busbar system as described in the following.

Figure 3:
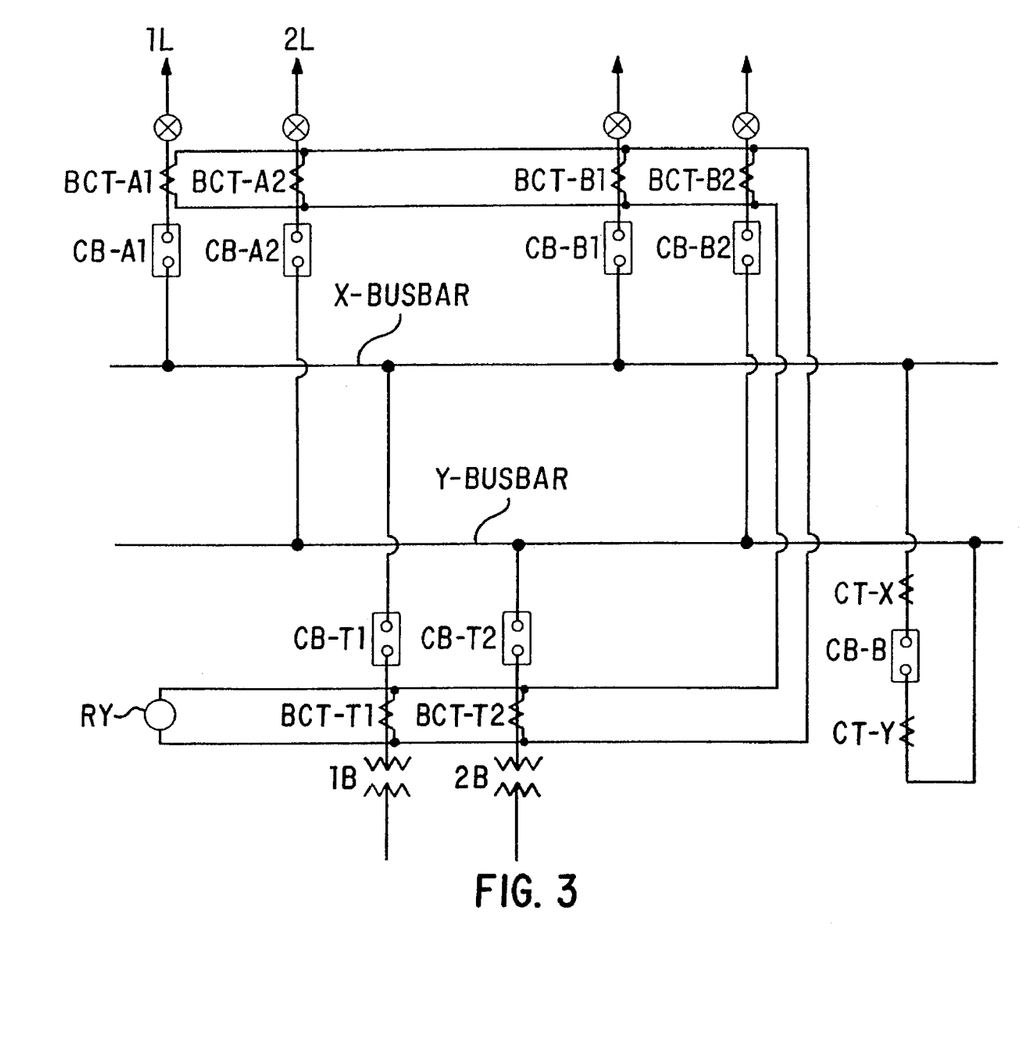
FIG. 3 is an explanatory diagram for showing a principle of the detection and protection method of fault.

FIG. 3 shows the principle of a whole protection method of the two or double busbars. In this figure, all of the secondary circuits of the current transformers BCT- installed in the lines or in the apparatus, such as transformers, are connected in parallel, and a detecting relay RY is also connected in parallel to the circuit thereof. Consequently, total of the detected current of all of the current transformers BCT- flows through the relay RY. Therefore, if fault does not occur at a busbar side relative to a position where the current transformers BCT are installed, the current flowing through the relay RY is zero. However, if fault has occurred elsewhere, a current corresponding to that flowing in the faulted point flows through the relay RY. In order to detect the fault on the busbar, the relay RY is actuated when current flowing through the relay exceeds the predetermined threshold where errors of the current transformer are taken into account.

In many cases, fault of the two or double busbars occurs on either the X-busbar or the Y-busbar, but rarely, fault occurs simultaneously on both busbars. Accordingly, it is desirable to detect the fault and identify which of the X-busbar or the Y-busbar has fault. In order to continue electric power supply, it is more advantageous to isolate the faulted busbar and to keep the sound busbar alive rather than to isolate both of the busbars. According to FIG. 4, a method to identify the faulted busbar against the sound busbar is described in the following.

Figure 4:
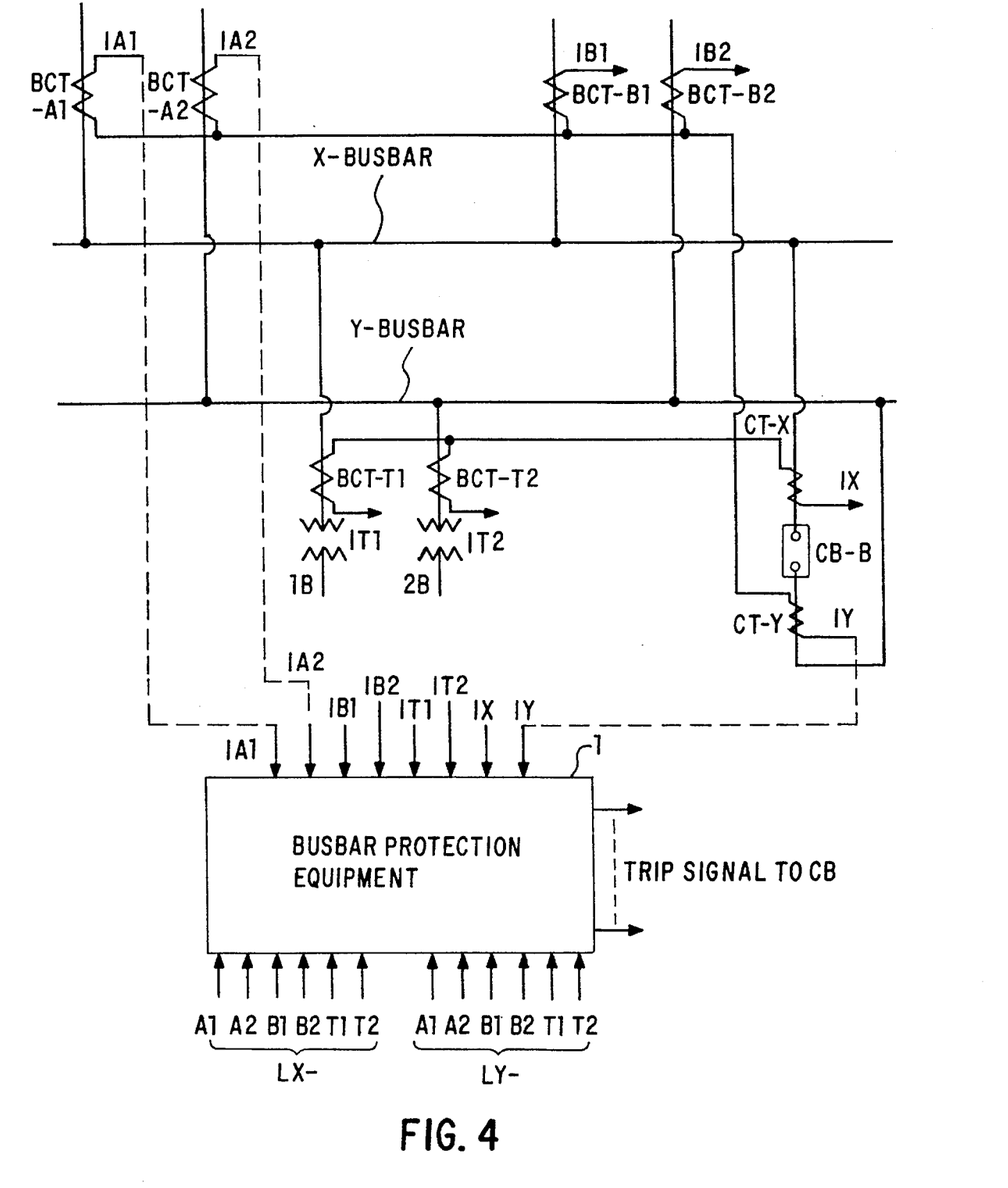
FIG. 4 is an explanatory diagram for showing a principle of the sectional protection method.

As shown in FIG. 4, inputted to a busbar protection equipment 1 are data, such as the current signals outputted from the current transformers BCT- installed in the lines, apparatus and etc., the current signals outputted from the current transformers BCT- for interlinking the busbars and the output signals for indicating the switching states of the line switches LX- and LY-, i.e. "open" or "closed".

A digital processing device is built in the busbar protection equipment 1. The foregoing input signals are sampled by the digital processing device in a certain period, and, on the basis of the data thereof, digital computing is then performed according to the following calculations. Not only an instantaneous value of the current but also a value vectorically synthesized from the effective value of the currents are available in this calculation. In this figure, the current of a single phase is expressed. However, three phase currents may be handled in practical cases.

$$\Sigma I \text{ (the secondary current of the current transformer which are electrically connected to the LX-)} > K \quad (1)$$

$$\Sigma I \text{ (the secondary current of the current transformer which are electrically connected to the LY-)} > K \quad (2)$$

$$\Sigma I \text{ (the secondary current of the current transformer other than IX and IY)} > K \quad (3)$$

wherein the $\Sigma$ designates a total of the currents I, and the K designates a threshold value. The equation (1) indicates that the fault has occurred on the X-busbar, the equation (2) indicates that the fault has occurred on the Y-busbar, and the equation (3) indicates that the fault has occurred somewhere on the busbars without identifying the faulted busbar (the X-busbar or the Y-busbar).

Therefore, a trip command to the circuit breaker CB- is outputted from the busbar protection equipment 1, according to the following conditions:

(a) The trip command for the circuit breakers connected to the X-busbar is based on (3) ^ (1)

(b) The trip command for the circuit breakers connected to the Y-busbar is based on (3) ^ (2)

(c) The trip command for all of the circuit breakers is based on (3) ^ (2) (−) ^ (1) (−)

where the ^ indicates the logical product (and), and the (1) (−) and (2) (−) designate invalidity of equation (1) and (2) respectively.

In practice, in order to keep the apparatus sound and safe, some conditions are added to the foregoing logical product (and), such as detection of a voltage fall in the faulted phase, a zero-sequence voltage generated due to the line-to-ground fault, or an overcurrent in the busbar interlink.

However, according to the aforementioned method by which the fault is detected and protected on a basis of the busbar as a unit, it is not possible to detect the location where the fault has occurred. Therefore, this method provides no proper protection and this has been an open problem.

The present invention has been completed to eliminate the foregoing problems associated with the conventional busbar protection method.

The object of the present invention is to detect a fault which has occurred on the busbar and to specify a specific fault section of the busbar and to thus provide a more proper protection of the busbar.

SUMMARY OF THE INVENTION

In the method of specifying a fault section of a busbar, it is judged whether a fault has occurred or not on the basis of the current detected by current detectors installed in the busbar and at least in a line or apparatus connected thereto. When designating a line or apparatus as A or A-1L in FIG. 1, a connecting point thereof to the busbar as A1 and the location of a current detector installed in the line or apparatus A as A2, the method includes the steps of computing the current of the line A from the current detected by the current detector excluding the current detector of the location A2, e.g. current detector at a point Q, R and so on in FIG. 1, computing the difference between the foregoing current and the current detected by the current detector at the location A2, and then judging that if the foregoing current exceeds a predetermined value, the fault has occurred on the section between the connecting point A1 and the location A2.

Further, in the method of the invention, it is judged whether a fault has occurred or not, on the basis of the currents detected by the current detectors installed in the busbar and at least two lines or apparatus connected thereto. When designating a line or apparatus as A or A-1L in FIG. 1, another line or apparatus as B or 1B in FIG. 1, a connecting point of the line or apparatus A to the busbar as A1 as well as another connecting point of the line or apparatus B to the busbar as B1, on the basis of the currents detected by the detectors, e.g. current detectors at point A2, R and so on, the difference between the current flowing out from the connecting point A1 toward the connection point B1 and the current flowing into the connection point B1 from the direction of the connecting point A1 is measured, and it is judged that if the foregoing current exceeds a predetermined value, the fault has occurred on the section between the connecting points A1 and B1.

And further, in the method of the invention, it is judged whether a fault has occurred or not, on the basis of the currents detected by the currents detector installed in the busbar and at least two lines or apparatus connected thereto. When designating a line or apparatus as A or A-1L in FIG. 1, another line or apparatus adjacent thereto as B or 1B in FIG. 1, a connecting point of the line or apparatus A to the busbar as A1 as well as a connecting point of the line or apparatus B to the busbar as B1, and further the location of a current detector installed in the line or apparatus A as A2, the method includes the steps of computing the current of the line A from the current detected by the current detector excluding the current detector of the location A2, e.g. current detector at a point Q, and computing the difference between the foregoing current and the current detected by the current detector of the location A2. In case the foregoing current difference does not exceed a predetermined value, the difference between the current flowing out from the connecting point A1 toward the connecting point B1 and the current flowing into the connection point B1 from the direction of the connecting point A1 is calculated by current detectors installed appropriately. Further, in case the foregoing current difference does not exceed a predetermined value, the sum of the currents flowing into the busbar, e.g. i2' and iB1, and flowing out from the busbar, e.g. iB, excluding the end of the busbar is calculated, and it is judged that if the foregoing current sum exceeds a predetermined value, the fault has occurred at the end section of the busbar.

In the method of the invention, the busbars belong to a double or two busbar system, wherein in each busbar, a line or apparatus is connected via a line switch, and it is possible to select for calculation the current value of the current detectors according to the information on the switching state of the line switches. The busbar may belong to a single busbar system.

Figure 5A:
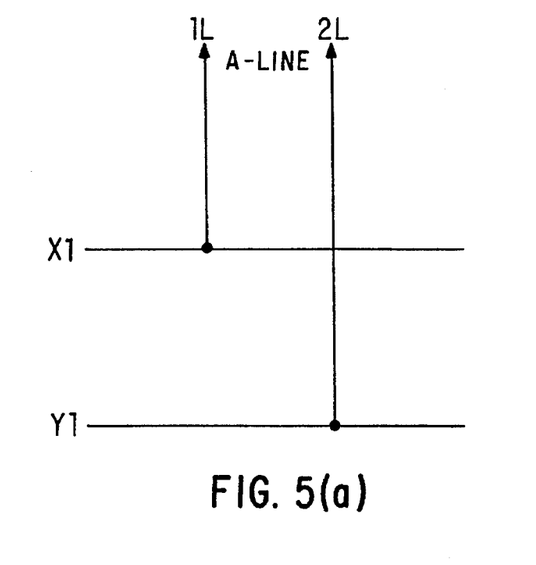
FIGS. 5a and 5b are a detailed diagram showing a part of FIG. 2.
Figure 5B:
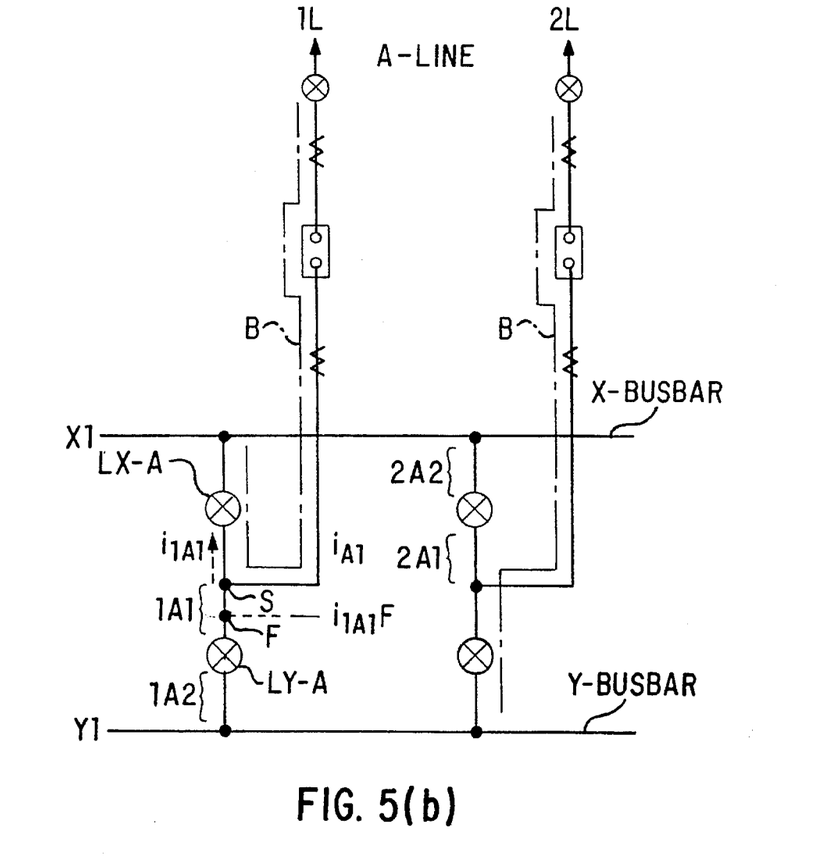

In the method of specifying a fault section in the double busbar system of the invention, when designating two busbars as X-busbar and Y-busbar, and a line or apparatus as A connected to the connecting point S (FIG. 5(b)), to which the X-busbar and the Y-busbar are also connected via a line switch LX-A and a line switch LY-A respectively, the line switch LX-A being closed and the line switch LY-A being opened, the current e.g. i1A1, flowing through the line switch LX-A is computed, and the difference between the above current and the current, e.g. iA1, detected by the current detector installed in the line or apparatus A before the point S is computed, and then it is judged that if the foregoing current difference exceeds a predetermined value, the fault has occurred on the section between the connecting point S and the line switch LY-A.

If a fault has occurred on the section between the current transformer and the connecting point thereof to the busbar (the first section), or on the busbar section between the adjacent line outlets (the second section), the resulting fault current is expressed as an equation of the output current of each current transformer, that is, of the observable values. The above current computed as the equation is zero in a normal condition where no fault occurs on the busbar, but in case of a fault, it reaches a definite value other than zero. Noticing this point, it is possible to detect the fault and to specify the faulted point to the specific section. If the currents of the foregoing first and second sections are zero, but the foregoing current sum exceeds a predetermined threshold, then it is judged that the fault has occurred on the section of the busbar end.

DETAILED DESCRIPTION OF PREFERRED EMBODIMENTS

Figure 1:
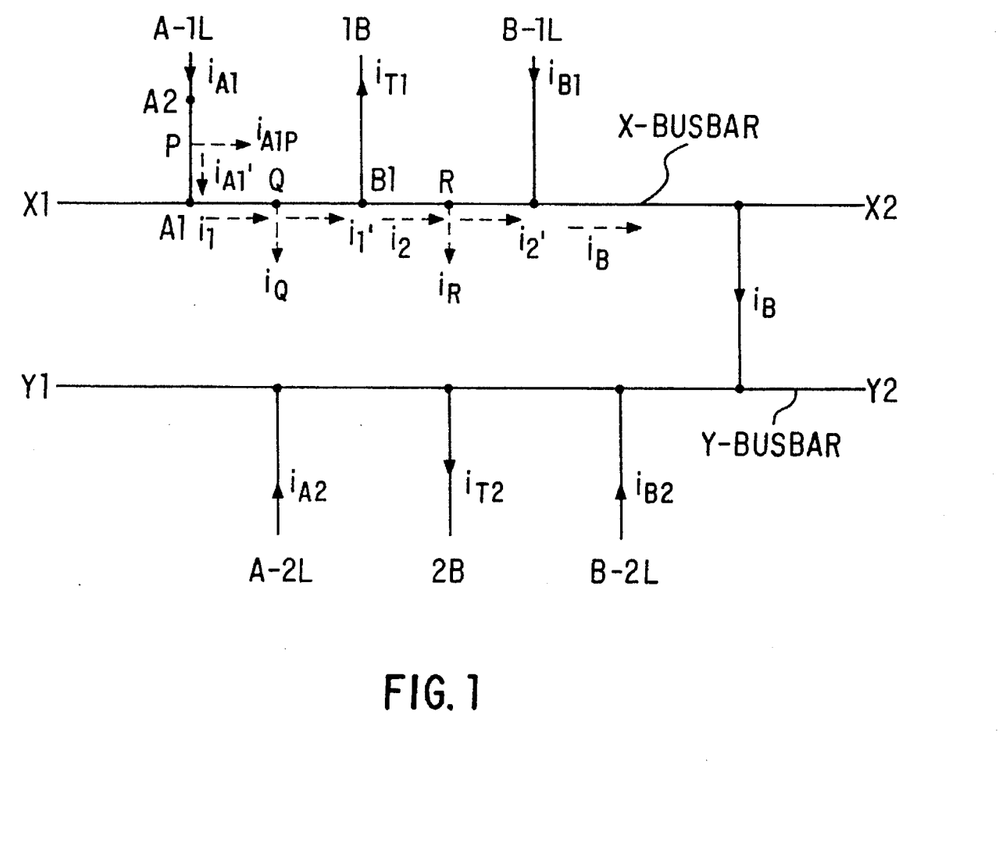
FIG. 1 is an explanatory diagram for showing a principle of the present invention.

FIG. 1 is a diagram to describe the principle of the present invention, which is shown more abstractly than FIG. 4. The current iA1 in FIG. 1 corresponds to the current IA1, and iA2, iB, iB1, iB2, iT1, iT2 are also the same as aforementioned. For detecting the respective current values, any kind of current detectors are applicable including the current transformer (CT) without limitation.

Since the currents in FIG. 1 are detected by the current transformers BCT-, it is judged in FIG. 2 that, in case of a fault on the X-busbar, it occurs on the busbar between the X-busbar and the BCT- connected to the CT-X, and that in case of a fault on the Y-busbar, it occurs on the busbar between the BCT- connected to the Y-busbar and the CT-Y. However, if observed in detail, sections of the faulted busbar can be classified in the following three categories.

(1) A section between the BCT- and the connecting points to the busbar of the line or of the apparatus in which the BCT- is installed.

(2) A section between the connecting points to the busbar of the adjacent lines or of the adjacent apparatus.

(3) A section between the busbar end and the adjacent connecting point thereof (4 sections at X1, X2, Y1 and Y2).

According to the conventional busbar protection method, a fault which has occurred on either of the foregoing sections is totally handled as the fault on the X-busbar or on the Y-busbar. However, in the present invention, it is possible to identify the above 3 categories. Moreover, in category (1) or (2), the specific section among the sections can be identified. Each category is described in detail as follows:

Category (1)

Assuming in FIG. 1 that a fault has occurred at the point P and a fault current iA1P flows, it is possible to detect the fault at the point P, if the foregoing current iA1P can be expressed in terms of the observable or measurable currents iA1, iA2, iB1, iB2, iT1, iT2 and iB. Assuming thus a current illustrated as a dot line in FIG. 1, the current can be expressed as:

$$iA1'=iT1+iB-iB1 \qquad (4)$$

Thus, $$iA1P=iA1'-iA1=iT1+iB-iB1-iA1 \qquad (5)$$

The current iA1P is equal to zero, when no fault occurs. Accordingly, if the current iA1P is not zero, this indicates that the fault has occurred at the point P.

The present invention sets a predetermined threshold K against the current iA1P at the point P, which is expressed as the equations of the observable values. According to the present invention, if, $$iA1P>K \qquad (6)$$

then, it is judged that the fault has occurred on the section between the connecting point of the line A-1L to the X-busbar and the current transformer BCT-A1 by which the current iA1 is detected. As for the above point P, this may be set anywhere between the connecting point to the busbar and the current transformer BCT-A1. This can be also set between the connecting point to the busbar and the current transformer BCT-A2, BCT-B1, BCT-B2, BCT-T1 and BCT-T2.

Category (2)

The aforementioned thought can be applied to the points Q and R located between the adjacent line outlets. In other words, in the point Q as shown in FIG. 1, the currents, i1 and i1' are expressed as:

$$i1=iA1$$

$$i1'=iT1+iB-iB1$$

Therefore, the current flowing through the point Q is expressed as:

$$iQ=i1'-i1=iT1+iB-iB1-iA1 \qquad (7)$$

In the same way, the current iR expressed as i2, i2' flowing through the point R is expressed as:

$$i2=iA1-iT1$$

$$i2'=iB-iB1$$

$$iR=i2'-i2=iB-iB1-iA1+iT1 \qquad (8)$$

In either case, the current iQ or iR is expressed as the equations of the observable values. This can be applied to other busbar sections between the adjacent line outlets.

Category (3)

This category is handled in the same way as in the cases where a fault has occurred on the X-busbar or the Y-busbar. If a fault has occurred on the X-busbar end, the currents, iA1P, iQ and iR of the points of the aforementioned categories (1) and (2) are nearly zero, and in addition, if the current iN of the following equation (9) exceeds a predetermined threshold, then it is considered that the fault has occurred on either of the busbar ends.

$$iN=iA1+iT1+iB1+iB \qquad (9)$$

However, it is difficult by this method to particularly point out the faulted point at the busbar end X1 and the adjacent section thereof or at the busbar end X2 and the adjacent section thereof. This is not practically important, since these sections are limited. Moreover, it is possible to form the busbars having no ends, wherein it is not necessary to consider category (3).

In the aforementioned description, categories (1), (2) and (3) are described separately. However, it is a general practice to integrate these categories in order to detect the fault and to thus protect the busbar with the protecting relays. Also, in the aforementioned description, the present invention has been described for the case of the double busbars, but it is also applicable to the single busbar or the ring busbar.

The aforementioned description is based on FIG. 2 by changing FIG. 1. Considering that all of the busbar sections to which the voltage is applied, have possibility of occurrence of fault, it is necessary to adequately handle the sections, to which categories (1), (2) and (3) are not applicable, so that it is necessary to examine FIG. 2 in detail.

FIGS. 5(a) and 5(b) are connection diagrams for showing parts of the A-line 1L and 2L in FIG. 2, with reference to FIG. 4. FIG. 5(a) shows a part of the A-line 1L and 2L in FIG. 4, and FIG. 5(b) shows a section of the A-line 1L and 2L. As can be seen in these figures, the section with the chain line B in FIG. 5(b) is handled in FIG. 4.

In FIG. 5(b), electric power is not supplied to the sections 1A1, 1A2, 2A1 and 2A2, but the voltage is applied. As can be seen on the figure, the sections 1A2 and 2A2 can be handled as a whole with the busbars connected thereto, and thus be included in category (2). The sections 1A1 and 2A1, however, are not included in the aforementioned category (2), and so the aforementioned method proceeds as the following.

If it is assumed for example in FIG. 5(b) that a fault has occurred on the point F, the current i1A1 F flows. If the current i1A1 F is described by readable iA1, iA2, iB1, iB2, iT1, iT2 and iB, it is possible to specify that a fault occurred at F is included in 1A1.

Thus, assuming that electric current i1A1 as shown in dot line flows in the figure, the relation is expressed as the following equation.

$$i1A1\ F + i1A1 = iA1 \tag{10}$$

The current iA1 is expressed in the same equation as the current i1A1' in FIG. 1, and by using the equation (4), i1A1 F can be expressed as follows.

$$i1A1\ F = iA1 - i1A1 = iA1 - (iT1 + iB - iB1) = iA1 - iT1 - iB + iB1 \tag{11}$$

Thus, the current iA1 F can be expressed with some of the observable values iA1, iA2, iB1, iB2, iT1, iT2 and iB and this indicates that the fault on the point F is included in the section 1A1.

When the fault has not occurred on the point F, the current i1A1 F is zero. If the current i1A1 F is not zero, then it indicates that the fault has occurred on the point F, thus specifying the faulted point F to the section 1A1.

The present invention sets a predetermined value K1 for the current i1A1 on the point F:

$$i1A1 > K1 \tag{12}$$

If the i1A1 F exceeds the K1, then it is possible to judge that the fault has occurred in the section 1A1 in FIG. 5(b). If the point F is assumed, for instance, in the section 2A1 or elsewhere in other section of the interlinks, it is also possible to judge the fault occurrence in the same way. In detecting the fault on the single or double busbar system, the present invention provides a more fine busbar protection, which specifies the faulted double section of the busbar rather than the conventional method.

While the present invention has been explained with reference to the specific embodiments, the explanation is illustrative and the invention is limited only by the appended claims.

What is claimed is:

1. A method of detecting a fault section of a busbar comprising, providing at least one means (A) connected to the busbar at a point (A1), a plurality of current detectors connected to the busbar and said means (A), one of said current detectors being connected to said means (A) at a location (A2) and at least one current detector being connected to the busbar, and a busbar protection equipment connected to the current detectors, said busbar protection equipment;

computing a current flowing through a line where said means (A) is located by the at least one current detector different from the current detector at the location (A2);

computing a difference between the current detected by the at least one current detector and the current detected by the current detector at the location (A2); and judging that if the difference of the current exceeds a predetermined value, fault has occurred on a section between the point (A1) and the location (A2).

2. A method of detecting a fault section of a busbar as claimed in claim 1, wherein the busbar is a double busbar system, said means (A) being connected to each busbar through a line switch, current value of the current detectors for use in computing being selected according to information on a switching state of the line switch.

3. A method of detecting a fault section of a busbar as claimed in claim 2, wherein the two busbars are X-busbar and Y-busbar, the means (A) being connected to a connection point (S), to which the X-busbar and the Y-busbar are also connected via a line switch (LX-A) and a line switch (LY-A) respectively, and the line switch (LX-A) being closed and the line switch (LY-A) being opened;

said method computing a current flowing through the line switch (LX-A) by the current detected by a current detector;

computing a difference of the above current and the current detected by the current detector installed in the means (A); and judging that if said current difference exceeds a predetermined value, the fault has occurred on the section between the connecting point (S) and the line switch (LY-A).

4. A method of detecting a fault section of a busbar as claimed in claim 1, wherein the busbar is a single busbar system.

5. A method of detecting a fault section of a busbar as claimed in claim 1, wherein a plurality of said current detectors is connected to said busbar, said current flowing through the line where said means (A) is located being measured by said plurality of the current detectors.

6. A method of detecting a fault section of a busbar comprising, providing means (A) and (B) connected to the busbar, a plurality of current detectors connected to the busbar and said two means (A) and (B), said means (A) being connected to the busbar at a connecting point (A1) and said means (B) being connected to the busbar at a connecting point (B1), and a busbar protection equipment connected to the current detectors, said busbar protection equipment;

computing, on a basis of currents detected by said detectors, a difference between a current flowing out from the connecting point (A1) toward the connecting point (B1) and a current flowing into the connecting point (B1) from a direction of the connecting point (A1); and judging that if the difference of the current exceeds a predetermined value, fault has occurred on a section between the connecting points (A1) and (B1).

7. A method of detecting a fault section of a busbar as claimed in claim 6, wherein the busbar is a double busbar system, said means (A) and (B) being connected to each busbar through line switches, current value of the current detectors for use in computing being selected according to information on a switching state of the line switch.

8. A method of detecting a fault section of a busbar as claimed in claim 6, wherein the busbar is a single busbar system.

9. A method of detecting a fault section of a busbar comprising, providing means (A) and (B) connected to the busbar, a plurality of current detectors connected to the busbar and said two means (A) and (B), and a busbar protection equipment connected to the current detectors, said means (A) being connected to the busbar at a connecting point (A1), said means (B) being located adjacent to the means (A) and being connected to the busbar at a connecting point (B1), one of said current detectors being connected to said means (A) at a location (A2), said busbar protection equipment;

computing a current flowing through a line where said means (A) is located by at least one of the current detectors different from the current detector at the location (A2);

computing a first difference between the current detected by said at least one of the current detectors and a current detected by the current detector at the location (A2);

computing by the current detectors a second difference between a current flowing out from the connecting point (A1) toward the connecting point (B1) and a current flowing into the connecting point (B1) from a direction of the connecting point (A1); and judging that fault has occurred at an end section of the busbar if said first difference does not exceed a predetermined value, said second difference does not exceed a predetermined value and sum of currents flowing into or flowing out from the busbar excluding the end section of the busbar exceeds a predetermined value.

10. A method of detecting a fault section of a busbar as claimed in claim 9, wherein the busbar is a double busbar system, said means (A) and (B) being connected to each busbar through line switches, current value of the current detectors for use in computing being selected according to information on a switching state of the line switch.

11. A method of detecting a fault section of a busbar as claimed in claim 9, wherein the busbar is a single busbar system.

12. A method of detecting a fault section of a busbar as claimed in claim 9, wherein a plurality of said current detectors is connected to said busbar, said current flowing through the line where said means (A) is located being measured by said plurality of the current detectors.

* * * * *

UNITED STATES PATENT AND TRADEMARK OFFICE
CERTIFICATE OF CORRECTION

PATENT NO. : 5,566,082
DATED : October 15, 1996
INVENTOR(S) : Isamu Suzuki

It is certified that error appears in the above-indentified patent and that said Letters Patent is hereby corrected as shown below:

column 3, line 57, change "currents detector" to --current detectors--;

column 4, line 61, change "a detailed diagram showing a part" to --detailed diagrams showing parts--;

column 5, line 9, delete "X-busbar and the" and add "X-busbar and the" before "CT-X"; and     column 7, line 48, delete "double".

Signed and Sealed this

Ninth Day of December, 1997

Attest:

BRUCE LEHMAN

Attesting Officer      Commissioner of Patents and Trademarks